(12) United States Patent
Nishizawa et al.

(10) Patent No.: US 7,930,071 B2
(45) Date of Patent: Apr. 19, 2011

(54) FAN UNIT AND ELECTRONIC APPARATUS AND METHOD OF CONTROLLING THE SAME

(75) Inventors: Masatoshi Nishizawa, Kawasaki (JP); Tomoki Harada, Kawasaki (JP); Goro Nakagai, Kawasaki (JP); Toyohiro Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 281 days.

(21) Appl. No.: 12/230,995

(22) Filed: Sep. 9, 2008

(65) Prior Publication Data

US 2009/0009967 A1 Jan. 8, 2009

Related U.S. Application Data

(63) Continuation of application No. PCT/JP2006/304621, filed on Mar. 9, 2006.

(51) Int. Cl.
*G05D 13/00* (2006.01)
(52) U.S. Cl. ........................................ 700/304
(58) Field of Classification Search .................. 700/300, 700/304; 361/679.48, 679.49, 688, 694, 361/697; 324/161, 166; 73/507
See application file for complete search history.

(56) References Cited

U.S. PATENT DOCUMENTS

| | | | |
|---|---|---|---|
| 6,023,144 A | 2/2000 | Imai et al. | |
| 6,118,654 A | 9/2000 | Bhatia | |
| 6,781,835 B2 * | 8/2004 | Hashimoto et al. | ............ 361/697 |
| 2002/0101714 A1 | 8/2002 | Osecky et al. | |
| 2003/0024683 A1 | 2/2003 | Nagai et al. | |
| 2004/0123978 A1 | 7/2004 | Hashimoto et al. | |
| 2007/0131383 A1 | 6/2007 | Hattori et al. | |

FOREIGN PATENT DOCUMENTS

| | | |
|---|---|---|
| EP | 1 798 629 A2 | 6/2007 |
| JP | 8-162789 | 6/1996 |
| JP | 9-182489 | 7/1997 |
| JP | 2000-153121 | 6/2000 |
| JP | 2000-325720 | 11/2000 |
| JP | 2002-62589 | 2/2002 |
| JP | 2004-63993 | 2/2004 |
| JP | 2004-263989 | 9/2004 |
| JP | 2005-4675 | 1/2005 |
| WO | 02/103505 A2 | 12/2002 |
| WO | 2004/059174 A1 | 7/2004 |

OTHER PUBLICATIONS

European Search Report dated Nov. 3, 2009 and issued in corresponding European Patent Application 06728838.1.
International Search Report issued on Sep. 18, 2008 in corresponding International Patent Application PCT/JP/2006/304621.

* cited by examiner

*Primary Examiner* — Albert Decady
*Assistant Examiner* — Chad Rapp
(74) *Attorney, Agent, or Firm* — Fujitsu Patent Center (57) ABSTRACT

The inventors have revealed that the actual rotation speed of the rotor in a fan structured as a centrifugal fan exceeds the designated rotation speed if the ventilation opening of the centrifugal fan is occluded. If a larger amount of dust accumulates at the ventilation opening of the centrifugal fan, for example, the actual rotation speed of the rotor in the centrifugal fan exceeds the designated rotation speed by a predetermined deviation. The accumulation of dust at the ventilation opening can in this manner be observed in a facilitated manner. The occlusion of the ventilation opening can thus be detected.

5 Claims, 8 Drawing Sheets

FAN UNIT AND ELECTRONIC APPARATUS AND METHOD OF CONTROLLING THE SAME

CROSS REFERENCE TO RELATED APPLICATIONS

This application is a continuing application, filed under 35 U.S.C. §111(a), of International Application PCT/JP2006/304621, filed Mar. 9, 2006, the disclosure of which is incorporated herein by reference.

BACKGROUND OF THE INVENTION

1. Field of the Invention

The present invention relates to a fan unit including a fan generating airflow.

2. Description of the Prior Art

A fan is incorporated in a water heater as disclosed in Japanese Patent Application Publication No. 8-178273, for example. The actual rotation speed of the fan is compared with a designated or target rotation speed of the fan for detection of a failure in the fan. When the actual rotation speed is significantly lower than the designated rotation speed, a failure, such as occlusion of a ventilation opening, deterioration of the fan, or the like, is detected in the fan.

A centrifugal fan is often utilized in a so-called notebook personal computer for cooling a central processing unit, CPU, for example. The inventors tried to detect occlusion of the ventilation opening of the centrifugal fan in the aforementioned manner. The inventors have practically examined the occlusion of a ventilation opening, namely the accumulation of dust in the ventilation opening. However, it has been confirmed that the aforementioned method cannot succeed in the detection of the occlusion of the ventilation opening.

SUMMARY OF THE INVENTION

It is accordingly an object of the present invention to provide a fan unit and an electronic apparatus capable of detection of the occlusion in a ventilation opening of a centrifugal fan.

According to a first aspect of the present invention, there is provided a fan unit comprising: a centrifugal fan generating airflow through rotation of a rotor; a rotation speed detecting circuit connected to the centrifugal fan, the rotation speed detecting circuit designed to detect an actual rotation speed of the rotor; and a deviation detecting circuit designed to detect the deviation between the actual rotation speed and a designated rotation speed specified in a control signal supplied to the centrifugal fan, the deviation detecting circuit outputting a predetermined signal when the actual rotation speed exceeds the designated rotation speed by a predetermined deviation.

The inventors have revealed that the actual rotation speed of the rotor in the fan structured as a centrifugal fan exceeds the designated rotation speed if the ventilation opening of the centrifugal fan is occluded. If a larger amount of dust accumulates at the ventilation opening of the centrifugal fan, for example, the actual rotation speed of the rotor in the centrifugal fan exceeds the designated rotation speed by a predetermined deviation. The deviation detecting circuit detects the deviation. The deviation detecting circuit outputs a predetermined signal. The accumulation of dust at the ventilation opening can in this manner be observed in a facilitated manner. The occlusion of the ventilation opening can thus be detected.

A specific method may be provided to control the fan unit of the above-mentioned type. The specific method may comprise: supplying a control signal to a centrifugal fan generating airflow through rotation of a rotor, the control signal specifying a designated rotation speed of the rotor; detecting an actual rotation speed of the rotor; detecting the deviation between the designated rotation speed and the actual rotation speed; and outputting a predetermined signal when the actual rotation speed exceeds the designated rotation speed by a predetermined deviation.

The fan unit may be incorporated in an electronic apparatus. The electronic apparatus may comprise: an enclosure; a centrifugal fan enclosed in the enclosure, the centrifugal fan generating airflow through rotation of a rotor; a rotation speed detecting circuit connected to the centrifugal fan, the rotation speed detecting circuit detecting an actual rotation speed of the rotor; and a deviation detecting circuit detecting the deviation between the actual rotation speed and a designated rotation speed specified in a control signal supplied to the centrifugal fan, the deviation detecting circuit outputting a predetermined signal when the actual rotation speed exceeds the designated rotation speed by a predetermined deviation. The electronic apparatus enables detection of the occlusion of the ventilation opening in the same manner as described above.

According to a second aspect of the present invention, there is provided an electronic apparatus comprising: an enclosure; a centrifugal fan enclosed in the enclosure, the centrifugal fan discharging air through a ventilation opening through rotation of a rotor; a dust catcher located in an air passage extending from the ventilation opening; a rotation speed detecting circuit connected to the centrifugal fan, the rotation speed detecting circuit designed to detect an actual rotation speed of the rotor; and a deviation detecting circuit designed to detect the deviation between the actual rotation speed and a designated rotation speed specified in a control signal supplied to the centrifugal fan, the deviation detecting circuit outputting a predetermined detection signal, the predetermined detection signal specifying accumulation of dust in a predetermined amount at the dust catcher when the actual rotation speed exceeds the designated rotation speed by a predetermined deviation.

The inventors have revealed that the actual rotation speed of the rotor in the fan structured as a centrifugal fan exceeds the designated rotation speed if the ventilation opening of the centrifugal fan is occluded. The dust catcher is located in the air passage extending from the ventilation opening of the fan. If a larger amount of dust accumulates at the dust catcher, for example, the ventilation opening of the centrifugal fan is occluded. The actual rotation speed of the rotor in the centrifugal fan thus exceeds the designated rotation speed by a predetermined deviation. The deviation detecting circuit detects the deviation. The deviation detecting circuit outputs a predetermined signal. The accumulation of dust at the ventilation opening can in this manner be observed in a facilitated manner. The accumulation of dust at the dust catcher or occlusion of the ventilation opening can thus be detected.

A specific method may be provided to control the electronic apparatus of the above-mentioned type. The specific method may comprise: supplying a control signal to a centrifugal fan, the control signal specifying a designated rotation speed of a rotor, the rotor rotating to generate airflow toward a dust catcher located in an air passage extending from the centrifugal fan; detecting an actual rotation speed of the rotor; detecting the deviation between the designated rotation speed and the actual rotation speed; and outputting a predetermined detection signal specifying the accumulation of dust in a predetermined amount at the dust catcher when the actual rotation speed exceeds the designated rotation speed by a predetermined deviation.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
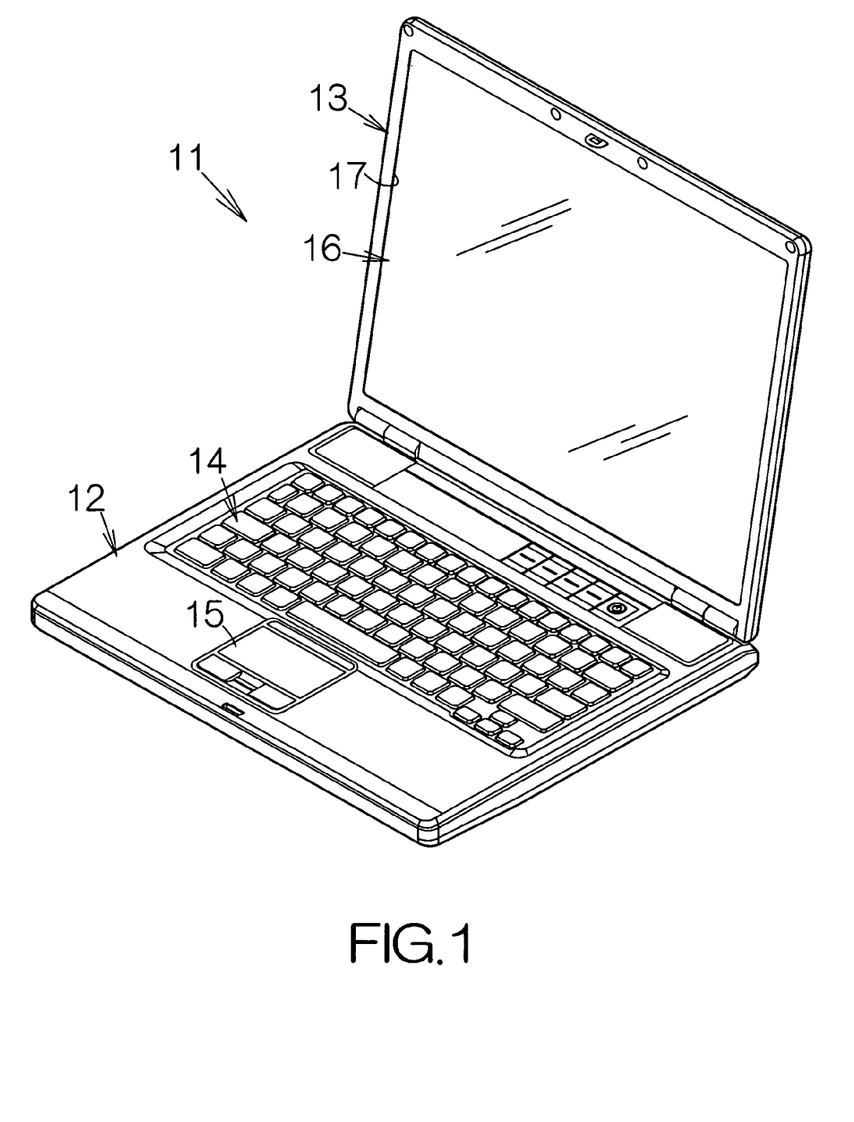
FIG. 1 is a perspective view schematically illustrating a notebook personal computer as a specific example of an electronic apparatus according to the present invention.

FIG. 1 schematically illustrates a notebook personal computer 11 as a specific example of an electronic apparatus according to the present invention. The notebook personal computer 11 includes a notebook-shaped main body 12 and a display enclosure 13 coupled to the main body 12 for pivotal movement. Input devices such as a keyboard 14 and a pointing device 15 are embedded in the front surface of the notebook-shaped main body 12. Users manipulate the keyboard 14 and/or the pointing device 15 to input commands and/or data.

A display device such as a liquid crystal display (LCD) panel module 16 is enclosed in the display enclosure 13, for example. The screen of the LCD panel module 16 is exposed in a window opening 17 defined in the display enclosure 13. Text and graphics are displayed on the screen. Users can see the ongoing operation of the notebook personal computer 11 based on the displayed text and graphics. The display enclosure 13 can be superposed on the notebook-shaped main body 12 through a pivotal movement relative to the notebook-shaped main body 12.

Figure 2:
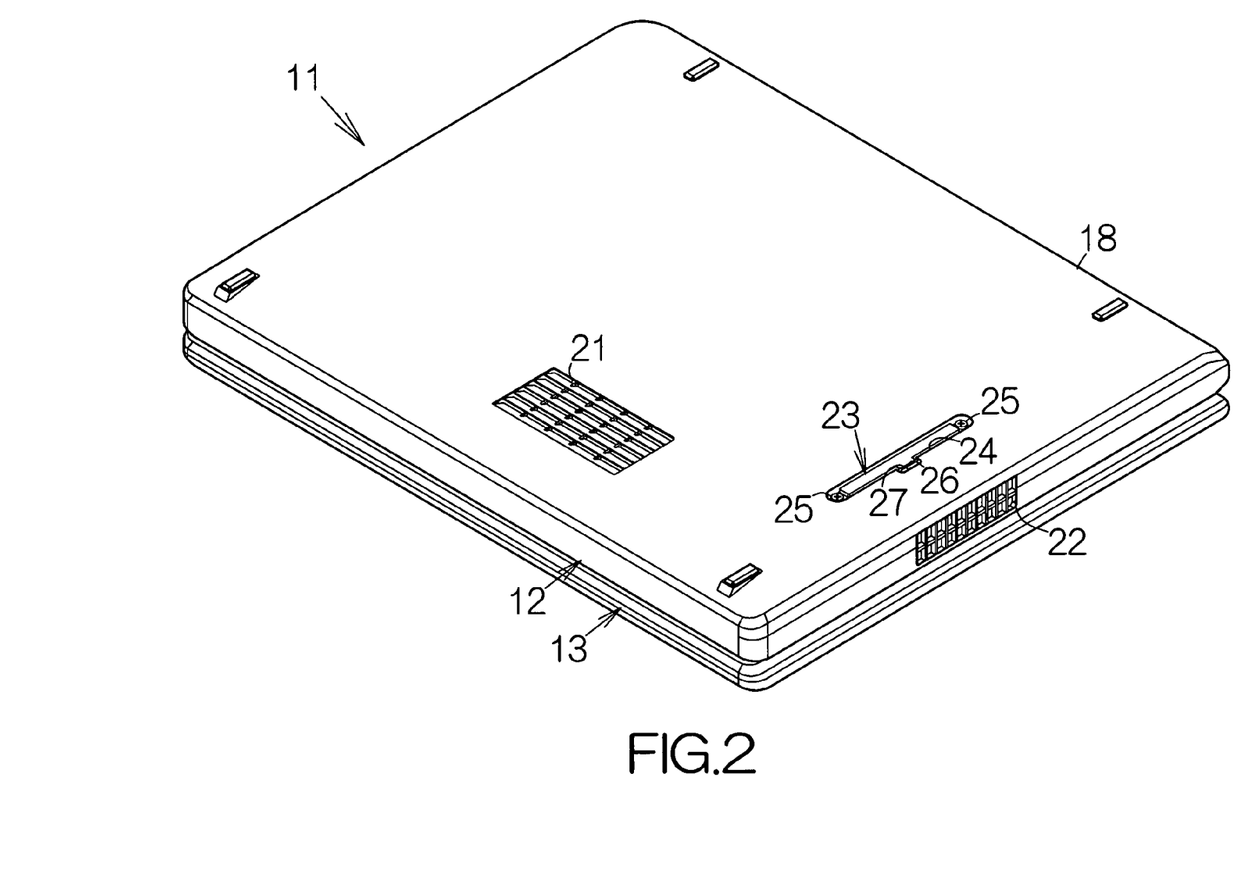
FIG. 2 is a perspective view schematically illustrating the bottom surface of a main body.

As shown in FIG. 2, an air inlet 21 and an air outlet 22 are defined in an enclosure 18 of the notebook-shaped main body 12. The air inlet 21 may be defined in the bottom plate of the enclosure 18, for example. The air outlet 22 may be defined in the side wall standing upright from the outer periphery of the bottom plate of the enclosure 18, for example. Fresh air is introduced through the air inlet 21 into the inner space of the enclosure 18 from the outer space of the enclosure 18. Air is discharged through the air outlet 22 from the inner space of the enclosure 18 into the outer space of the enclosure 18. When the notebook personal computer 11 is set on a desk, the bottom plate is usually opposed to the upper surface of the desk at a distance. The air outlet 22 is usually prevented from being covered with the desk.

A dust catcher 23 is removably mounted in the bottom plate of the enclosure 18 from the outside of the enclosure 18. An opening or slot 24 is defined in the bottom plate of the enclosure 18 for receiving the dust catcher 23. The dust catcher 23 is inserted into the inner space of the enclosure 18 through the slot 24. The dust catcher 23 is fixed to the bottom plate of the enclosure 18. A pair of screws 25 are utilized to fix the dust catcher 23, for example. The screws 25 are screwed into the bottom plate of the enclosure 18.

The dust catcher 23 includes a lug 26. The lug 26 is held in a depression 27 defined in the bottom plate of the enclosure 18. The depression 27 is continuous to the slot 24. Users can pull the lug 26 with a finger when they intend to remove the dust catcher 23, for example. The dust catcher 23 will be described later in detail.

Figure 3:
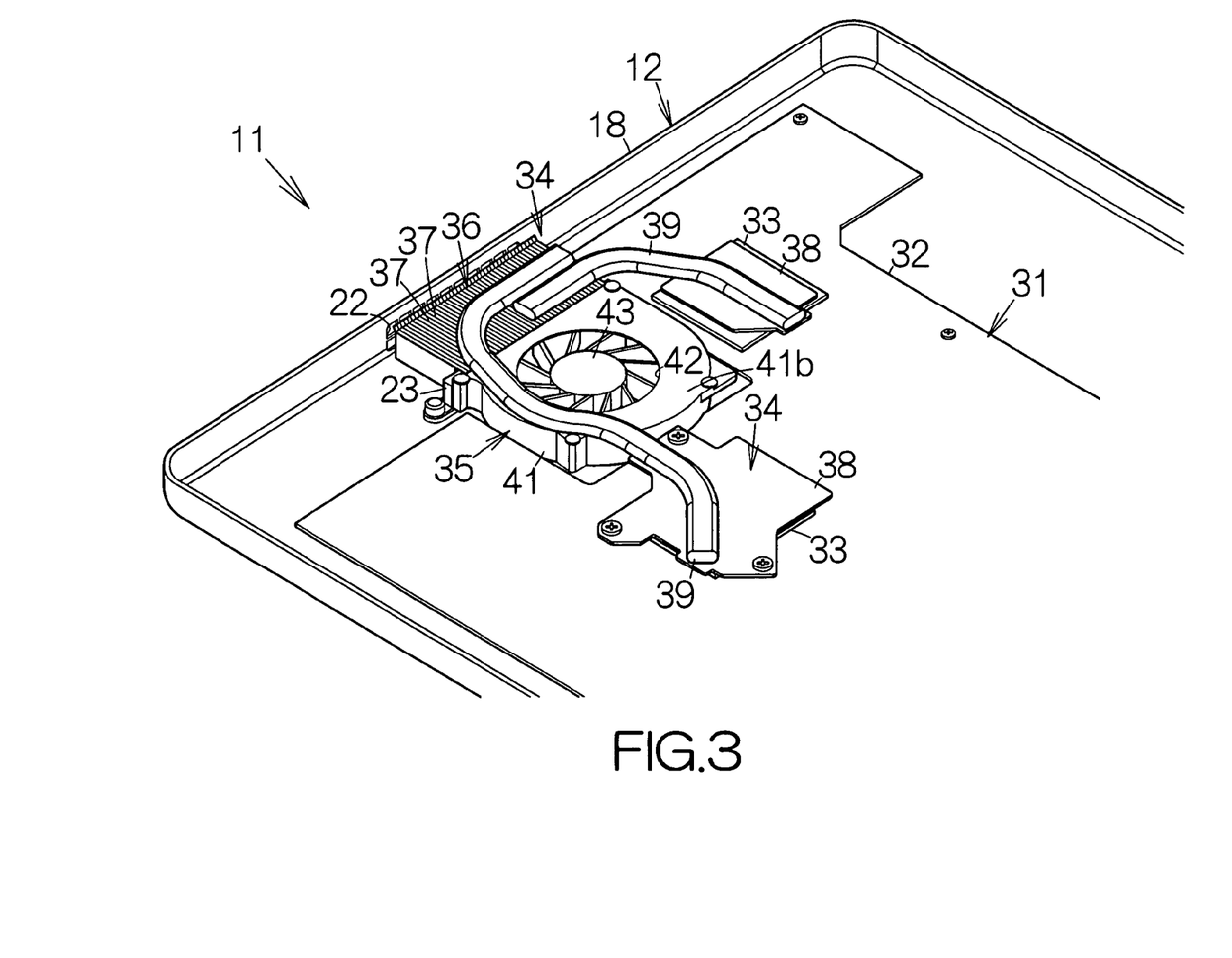
FIG. 3 is an enlarged partial perspective view schematically illustrating the inner structure of the main body.

As shown in FIG. 3, a printed circuit board unit 31 is enclosed in the enclosure 18 of the main body 12. The printed circuit board unit 31 includes a printed wiring board 32 and large-scale integrated circuit (LSI) packages 33, 33 mounted on the surface of the printed wiring board 32. The individual LSI package 33 includes a central processing unit (CPU) chip or a video chip, both not shown, mounted on a small-sized ceramic substrate, for example. The CPU chip executes various kinds of processing based on an operating system (OS) and application software, for example. The video chip executes various kinds of image processing in response to the instructions from the CPU chip, for example.

A cooling apparatus 34 is coupled to the LSI packages 33. The cooling apparatus 34 includes a ventilation apparatus, namely a fan unit 35. A heat radiating fin member 36 is located in a space between the fan unit 35 and the air outlet 22. The heat radiating fin member 36 includes heat radiating fins 37 extending in parallel with one another. Air passages are defined between individual adjacent ones of the heat radiating fins 37. The fan unit 35 generates airflow running through the air passages to the air outlet 22. The airflow serves to discharge heat of the heat radiating fins 37 out of the enclosure 18.

Heat conductive plates 38 are respectively superposed on the CPU chip and the video chip. A heat conductive member or heat pipe 39 is utilized to connect the individual heat conductive plate 38 and the heat radiating fins 37. Heat is transferred from the heat conductive plate 38 to the heat radiating fins 37 through the heat pipe 39. The heat conducive plates 38 are designed to receive heat from the CPU chip and the video chip.

The fan unit 35 includes a fan housing 41. The fan housing 41 defines a predetermined inner space. Air suction openings 42, only one shown, are formed in the fan housing 41. The air suction openings 42 serve to connect the inner space to the outside of the fan housing 41. A fan 43 is enclosed in the fan housing 41.

Figure 4:
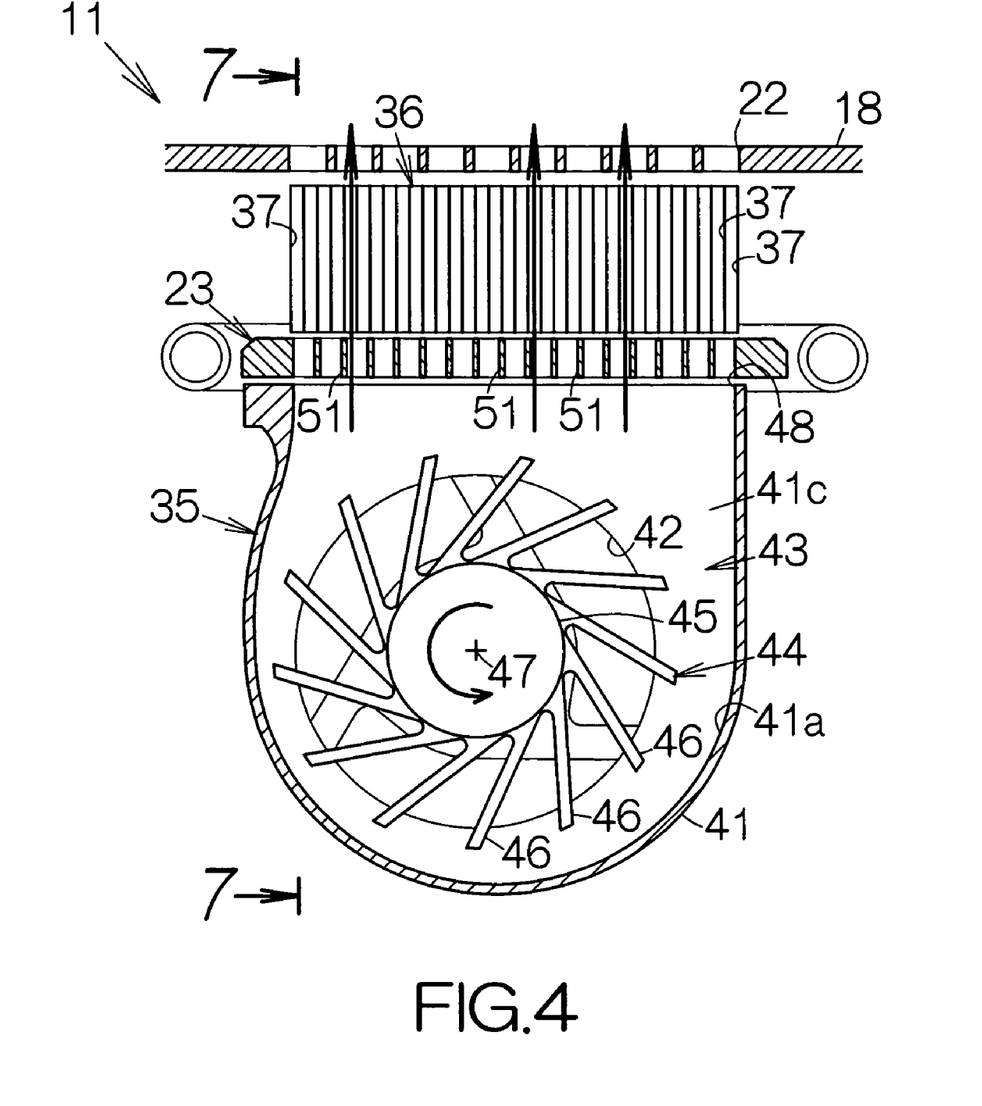
FIG. 4 is a partial sectional view schematically illustrating the structure of a cooling apparatus.

As shown in FIG. 4, a so-called centrifugal fan is employed as the fan 43. The fan 43 includes a rotor 44. The rotor 44 includes a rotating body 45 and blades 46 extending outward in the radial directions, namely in the centrifugal directions, from the rotating body 45 uniformly all around the rotating body 45. When the rotor 44 is driven to rotate around a rotation axis 47, air is introduced along the rotation axis 47 through the air suction openings 42. The rotation of the blades 46 generates airflow in the centrifugal direction.

The fan housing 41 defines a surrounding side wall 41a, a top plate 41b, shown in FIG. 3, and a bottom plate 41c. The surrounding side wall 41a is located at a position outside the rotor 44 in the radial direction. The top plate 41b and the bottom plate 41c are coupled to the upper and lower ends of the surrounding side wall 41a, respectively. The inward surface of the surrounding side wall 41a is opposed to the outer ends of the blades 46 of the rotor 44. The air suction opening 42 is defined in each of the top plate 41b and the bottom plate 41c. The surrounding side wall 41a has a gap for defining a ventilation opening 48 between the top plate 41b and the bottom plate 41c. The ventilation opening 48 is located at a position outside the rotor 44 in the centrifugal direction.

The ventilation opening 48 is opposed to the heat radiating fin member 36 at a distance. The centrifugal airflow is guided to the ventilation opening 48 along the inward surface of the surrounding side wall 41a. The airflow is then discharged through the ventilation opening 48. The heat radiating fin member 36 serves to guide the airflow to the air outlet 22. In other words, the heat radiating fin member 36 defines an air passage extending from the ventilation opening 48 to the air outlet 22. The heat radiating fins 37 are located within the air passage.

As is apparent from FIG. 4, the dust catcher 23 is located within the air passage between the ventilation opening 48 and the heat radiating fins 37, namely between the fan 43 and the heat radiating fins 37. The dust catcher 23 includes lattice components 51 located at positions adjacent to the upstream edges of the heat radiating fins 37. The lattice components 51 may be plates extending in parallel with one another. The lattice components 51 are designed to extend along imaginary planes including the heat radiating fins 37. The downstream edges of the lattice components 51 may be continuous with the upstream edges of the corresponding heat radiating fins 37. The airflow At least the upstream edges of the heat radiating fins 37 are located off the airflow behind the lattice components 51.

The number of lattice components 51 may depend on the thickness of the individual lattice component 51. Additionally, any other conditions, such as the size of pieces of dust, the amount of airflow for sufficiently cooling the heat radiating fins 37, or the like, may be considered to determine the number of lattice components 51. Here, the lattice components 51 are assigned to every other heat radiating fin 37. The spaces between the lattice components 51 are thus set wider or larger than the spaces between the heat radiating fins 37. The lattice components 51 are expected to catch relatively large-sized pieces of trash, such as pieces of thread. Such trash is prevented from getting into the heat radiating fin member 36. Relatively small-sized pieces of trash, such as dust, is allowed to pass through the spaces between the lattice components 51 as well as the spaces between the heat radiating fins 37. The relatively small-sized pieces of trash are expected to get out of the enclosure 18 through the air outlet 22. Some pieces of the relatively small-sized trash may also be attached to the lattice components 51.

Figure 5:
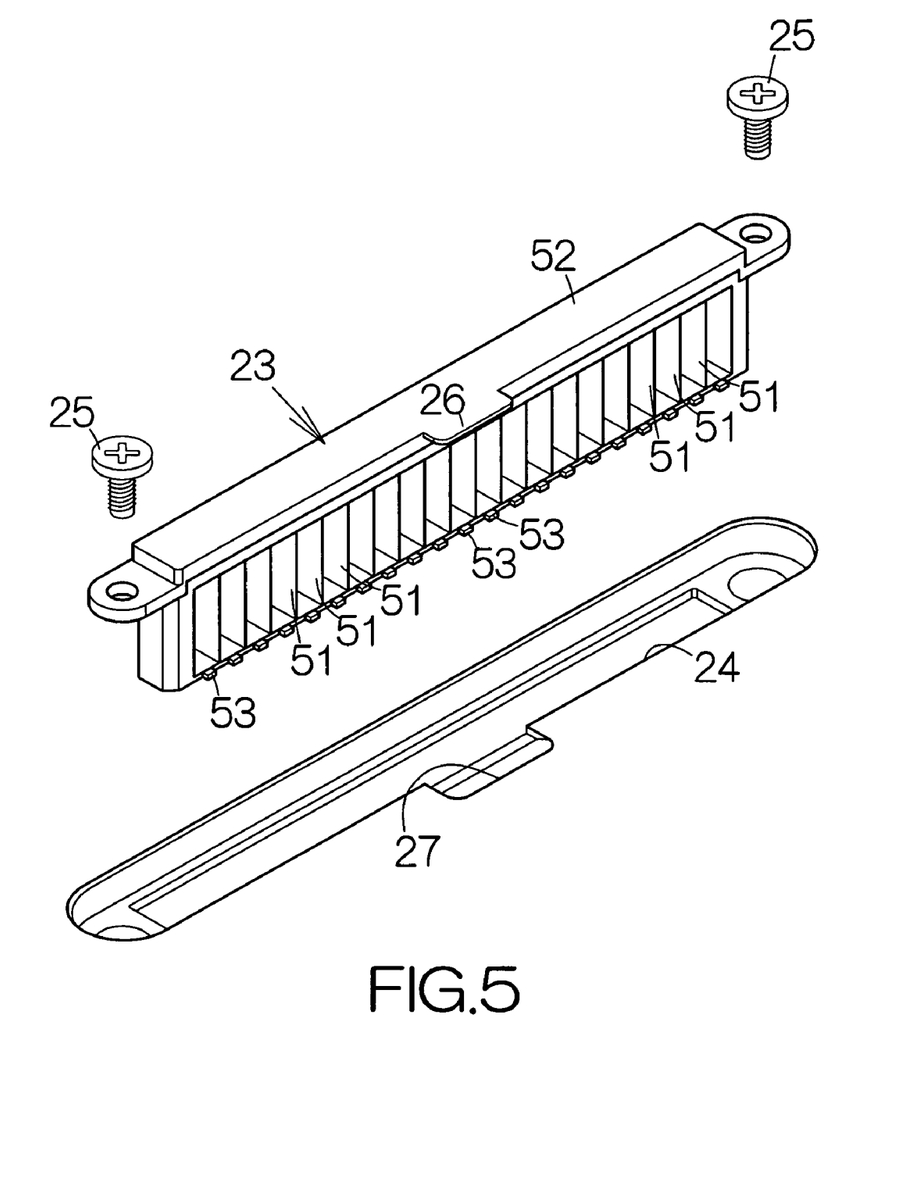
FIG. 5 is a perspective view schematically illustrating the structure of a dust catcher.

As shown in FIG. 5, the dust catcher 23 includes a frame 52 holding the lattice components 51. The frame 52 defines an air passage in a space between the ventilation opening 48 and the heat radiating fin member 36. The lattice components 51 are located in the air passage. The frame 52 and the lattice components 51 may be formed in a one-piece component made of a resin material, for example. Molding process may be employed to form such a one-piece component, for example.

Here, asperity may be established on the upstream edges of the lattice components 51. A large number of minute particles may be adhered to the surfaces of the lattice components 51 for establishment of the asperity. Alternatively, a mold for forming the lattice components 51 may have the inner surface reflecting the asperity of the lattice components 51. The inner surface defines a cavity. Otherwise, the surfaces of the lattice components 51 may be subjected to abrasion with sandpaper, for example. A light tackiness may be added to the surfaces of the lattice components 51 instead of the asperity. A coating film serves to establish the light tackiness, for example.

Rake members 53 may be formed on the frame 52. The rake members 53 protrude downstream from the frame 52. The rake members 53 may be located at the intermediate positions between the adjacent ones of the lattice components 51, respectively. The individual rake member 53 may be formed in a piece of a small parallelepiped, for example. The rake members 53 may be formed integral with the frame 52 based on molding. Asperity may also be established on the surfaces of the rake members 53.

Figure 6:
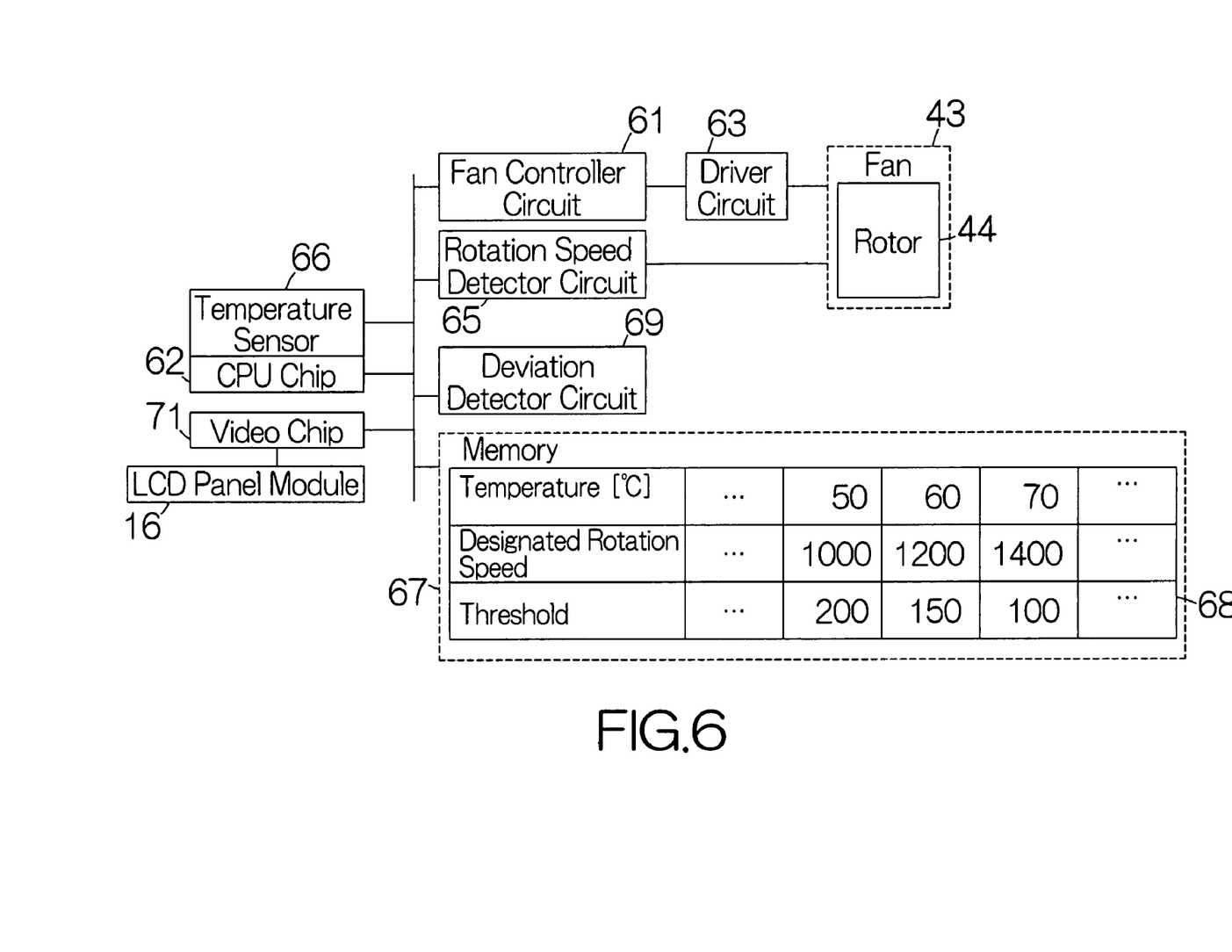
FIG. 6 is a block diagram schematically illustrating a control system of the notebook personal computer.

As shown in FIG. 6, the notebook personal computer 11 includes a fan controller circuit 61. The fan controller circuit 61 is designed to control the rotation speed of the rotor 44 of the fan 43 in accordance with the level of the temperature of the central processing unit (CPU) chip 62. A control signal is generated at the fan controller circuit 61 for controlling the rotation speed. The control signal specifies a designated rotation speed of the rotor 44.

A driver circuit 63 is connected to the fan controller circuit 61. An electric motor of the fan 43 is connected to the driver circuit 63. The driver circuit 63 is designed to control the electric motor based on the duty ratio and/or the voltage value. The drive circuit 63 generates a drive signal based on the control signal supplied from the fan controller circuit 61. The drive signal reflects the designated rotation speed specified in the control signal. The fan 43 in this manner generates airflow through the rotation of the rotor 44.

A rotation speed detecting circuit 65 such as an encoder is connected to the fan controller circuit 61. The rotation speed detecting circuit 65 is designed to detect the actual rotation speed of the rotor 44. The rotation speed detecting circuit 65 generates a rotation speed information signal. The actual rotation speed of the rotor 44 may be specified in the rotation speed information signal.

A temperature sensor 66 is connected to the fan controller circuit 61. The temperature sensor 66 is designed to detect the temperature of the CPU chip 62, for example. The temperature sensor 66 may be embedded in the CPU chip 62. The temperature sensor 66 supplies a temperature information signal to the fan controller circuit 61. The temperature of the CPU chip 62 may be specified in the temperature information signal.

A storage circuit such as a memory 67 is connected to the fan controller circuit 61. A data table 68 is established in the memory 67. The data table 68 holds values of a designated rotation speed and a threshold of the rotor 44 for various temperatures of the CPU chip 62. The threshold will later be described in detail. The fan controller circuit 61 selects a designated rotation speed in the data table 68 in accordance with the temperature of the CPU chip 62.

A deviation detecting circuit 69 is connected to the fan controller circuit 61. The deviation detecting circuit 69 is designed to detect whether or not the actual rotation speed is faster than the selected designated rotation speed. The deviation detecting circuit 69 calculates the deviation or difference between the designated rotation speed and the actual rotation speed. The control signal may be supplied to the deviation detecting circuit 69 from the fan controller circuit 61 for specifying the designated rotation speed. Alternatively, the deviation detecting circuit 69 may read the designated rotation speed in the data table 68 based on the temperature information signal. The actual rotation speed may be obtained based on the rotation speed information signal. The deviation detecting circuit 69 obtains the corresponding threshold out of the data table 68 in accordance with the level of the temperature specified in the temperature information signal. The deviation between the designated rotation speed and the actual rotation speed is compared with the obtained corresponding threshold.

A video chip 71 is connected to the CPU chip 62. The aforementioned LCD panel module 16 is connected to the video chip 71. When the actual rotation speed deviates from the designated rotation speed by a predetermined amount, the deviation detecting circuit 69 supplies a warning signal to the CPU chip 62. The CPU chip 62 executes processing in response to reception of the warning signal. The video chip 71 operates to display predetermined information on the screen of the LCD panel module 16 based on the calculation at the CPU chip 62.

Figure 7:
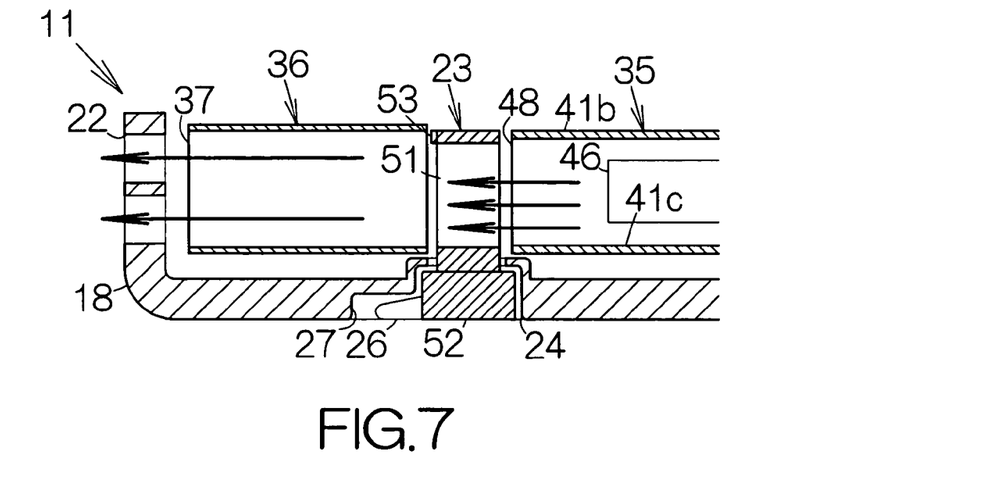
FIG. 7 is an enlarged partial sectional view taken along the line 7-7 in FIG. 4.

As shown in FIG. 7, when the dust catcher 23 is inserted into the slot 24 from the outside of the enclosure 18, the dust catcher 23 and the heat radiating fin member 36 in combination establish the air passage between the ventilation opening 48 and the air outlet 22. Airflow is discharged through the ventilation opening 48 in response to the supply of electric power to the fan 43. The discharged airflow is guided to the air outlet 22 along the air passage. The airflow is in this manner discharged out of the air outlet 22. Heat can be removed from the heat radiating fins 37 with a higher efficiency. Although the lattice components 51 have a thickness larger than that of the heat radiating fins 37, the heat radiating fins 37 can enjoy a sufficient amount of airflow because sufficient spaces are established between the adjacent lattice components 51.

Figure 8:
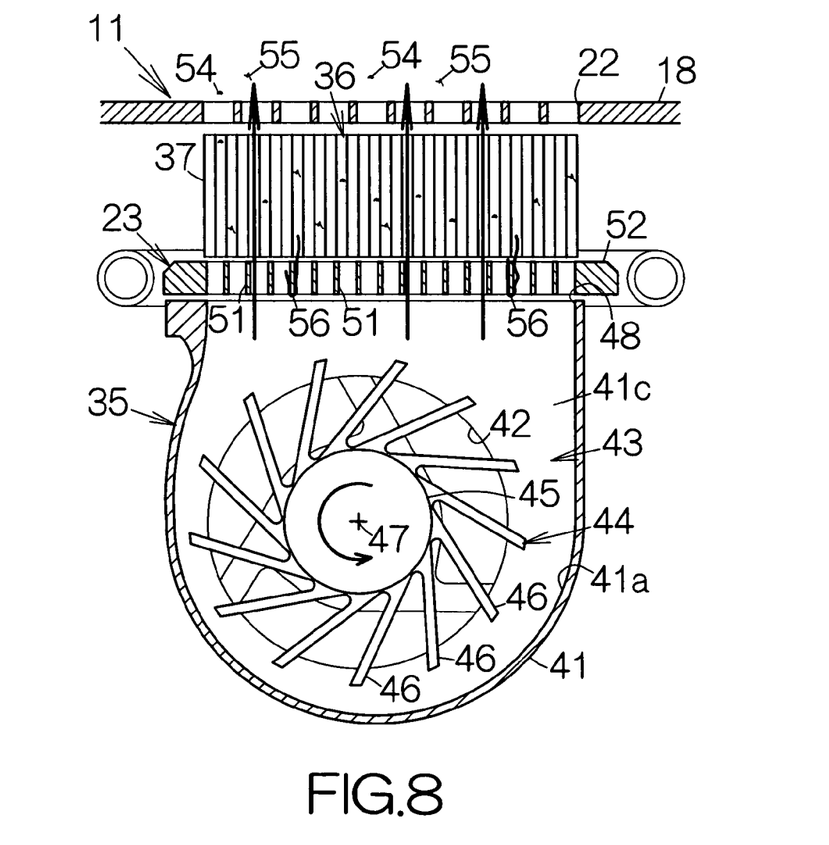
FIG. 8 is a partial sectional view, corresponding to FIG. 4, for schematically illustrating the cooling apparatus in operation.

The fan unit 35 serves to suck air within the entire space of the enclosure 18. Dust enters the enclosure 18 through not only the air inlet 21 but also any gaps of the enclosure 18. Such dust can be caught in the airflow discharged from the ventilation opening 48 of the fan unit 35. As shown in FIG. 8, fine particles 54 of dust and short pieces 55 of dust can pass through the dust catcher 23 and the heat radiating fin member 36. The fine particles 54 and the short pieces 55 are then discharged out of the air outlet 22. On the other hand, long pieces 56 of dust are caught at the upstream edges of the lattice components 51. The long pieces 56 gradually accumulate on the lattice components 51 as time elapses.

The rotation speed of the rotor 44 is controlled in the fan 43. The fan controller circuit 61 detects the temperature of the CPU chip 62 in this case. The fan controller circuit 61 serves to write a designated rotation speed into the control signal based on the temperature information signal. The electric motor drives the rotor 44 based on the designated rotation speed specified in the control signal. The rotation speed of the rotor 44 increases in response to a rise in the temperature of the CPU chip 62. In this manner, the CPU chip 62 is prevented from suffering from a higher temperature.

The rotation speed detecting circuit 65 detects the actual rotation speed of the rotor 44. The temperature information signal and the rotation speed information signal are supplied to the deviation detecting circuit 69. The deviation detecting circuit 69 specifies the designated rotation speed of the rotor 44 in accordance with the level of the temperature of the CPU chip 62. The deviation detecting circuit 69 calculates the deviation between the designated rotation speed and the actual rotation speed. The calculated deviation is compared with the threshold.

When the actual rotation speed exceeds the designated rotation speed by a deviation equal to or larger than the threshold, for example, the predetermined warning signal is supplied to the CPU chip 62 from the deviation detecting circuit 69. The CPU chip 62 executes processing in response to reception of the warning signal. The video chip 71 executes an image processing based on the calculation at the CPU chip 62. The CPU chip 62 operates to pop up a window of warning on the screen of the LCD panel module 16, for example. The user is recommended to remove the dust catcher 23 for cleaning. The user is in this manner notified of the optimal time for cleaning.

The dust catcher 23 can be removed from the bottom plate of the enclosure 18 as described above. The dust catcher 23 holds the long pieces 56 of dust on the lattice components 51 during the removal. The long pieces 56 are thus removed from the air passage along with the dust catcher 23. The long pieces 56 are thus reliably removed from the air passage. The dust catcher 23 can then be cleaned. The cleaned dust catcher 23 may again be set in the bottom plate of the enclosure 18. Airflow of a sufficient amount is in this manner always kept in the air passage. Heat is thus radiated from the heat radiating fins 37 in an efficient manner.

Figure 9:
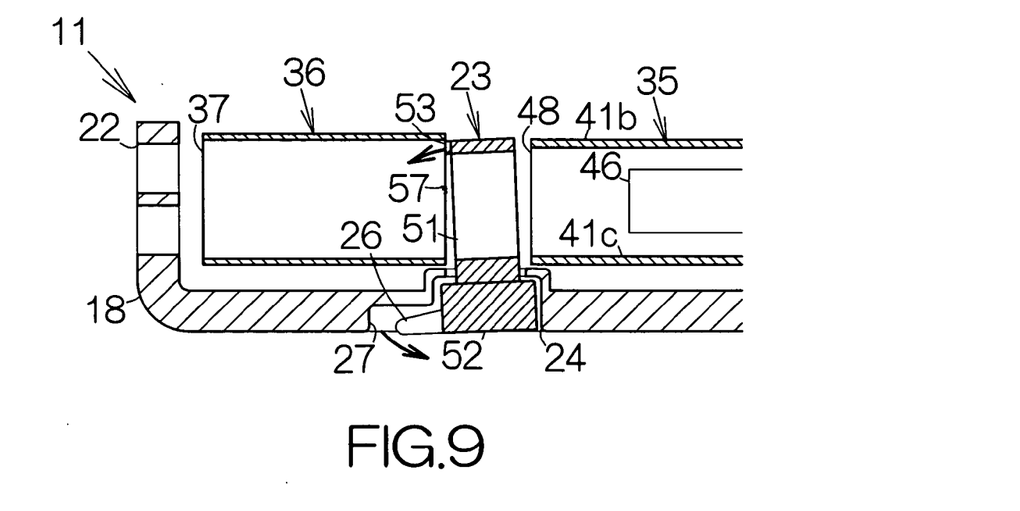
FIG. 9 is an enlarged partial sectional view, corresponding to FIG. 7, for schematically illustrating the removal of the dust catcher from the main body.
Figure 10:
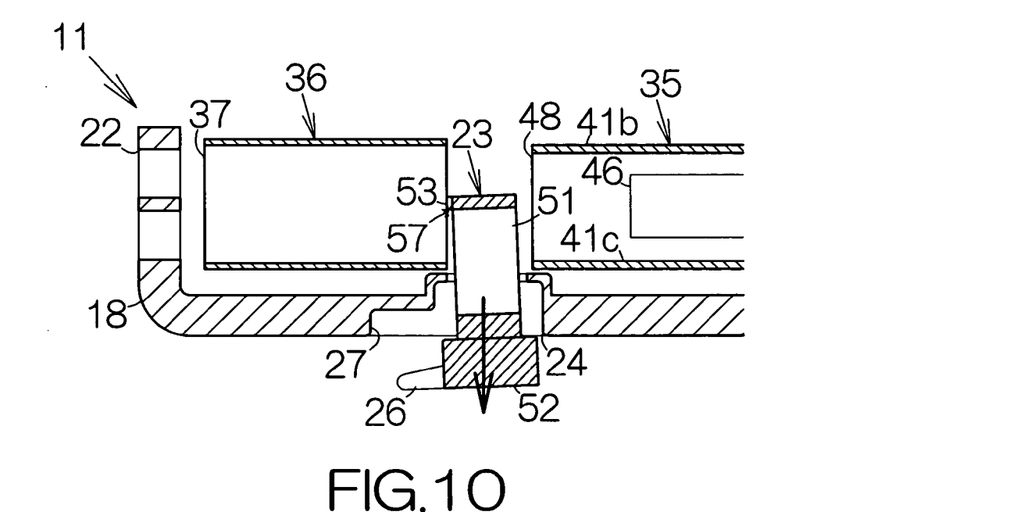
FIG. 10 is an enlarged partial sectional view, corresponding to FIG. 7, for schematically illustrating the removal of the dust catcher from the main body.

As shown in FIG. 9, the user is allowed to pull the lug 26 with a nail or finger when the user intends to remove the dust catcher 23. The frame 52 thus receives a force from the tip or free end of the lug 26. This results in an inclining movement of the frame 52. The rake members 53 are thus brought into contact with the upstream edges of the heat radiating fins 37. When the dust catcher 23 is subsequently withdrawn from the slot 24, the rake members 53 keep sliding along the corresponding upstream edges of the heat radiating fins 37, as shown in FIG. 10. The rake members 53 catch the dust 57 accumulated at the upstream edges of the heat radiating fins 37. The dust 57 can in this manner be scraped off the upstream edges of the heat radiating fins 37. The dust 57 can be removed away from the air passage. Airflow of a sufficient amount is in this manner always kept in the air passage.

The inventors have revealed that the actual rotation speed of the rotor 44 in the fan 43 structured as a centrifugal fan exceeds the designated rotation speed if a larger amount of dust accumulates at the dust catcher 23. The accumulation of the dust at the dust catcher 23 causes the rotor 44 to rotate at the actual rotation speed exceeding the designated rotation speed by a predetermined amount in the hard disk drive 11. The accumulation of dust can in this manner be observed in a facilitated manner. The occlusion of the ventilation opening 48 is reliably detected. The optimal time for cleaning the dust catcher 23 can be determined in a facilitated manner.

The fan unit 35 may allow the CPU chip 62 to take over the processing at the deviation detecting circuit 69. In this case, the CPU chip 62 may execute the processing based on a software program.

What is claimed is:

1. A fan unit comprising:
   a centrifugal fan generating airflow through rotation of a rotor;
   a rotation speed detecting circuit connected to the centrifugal fan, the rotation speed detecting circuit designed to detect an actual rotation speed of the rotor;
   a storage circuit storing data, the data including values of a designated rotation speed and a threshold for various temperatures; and
   a deviation detecting circuit designed to detect a deviation between the actual rotation speed and the designated rotation speed specified in a control signal supplied to the centrifugal fan, the deviation detecting circuit outputting a predetermined signal when the actual rotation speed exceeds the specified designated rotation speed by the deviation equal to or greater than the threshold, the deviation detecting circuit obtaining the threshold from the storage circuit in accordance with a level of a temperature specified in a temperature information signal.

2. A method of controlling a fan unit, comprising:

supplying a control signal to a centrifugal fan generating airflow through rotation of a rotor, the control signal specifying a designated rotation speed of the rotor;

detecting an actual rotation speed of the rotor;

obtaining a threshold from data stored in a storage circuit in accordance with a level of a temperature specified in a temperature information signal, the data including values of the designated rotation speed and the threshold for various temperatures;

detecting a deviation between the designated rotation speed and the actual rotation speed; and outputting a predetermined signal when the actual rotation speed exceeds the designated rotation speed by the deviation equal to or greater than the threshold.

3. An electronic apparatus comprising:

an enclosure;

a centrifugal fan enclosed in the enclosure, the centrifugal fan generating airflow through rotation of a rotor;

a rotation speed detecting circuit connected to the centrifugal fan, the rotation speed detecting circuit detecting an actual rotation speed of the rotor;

a storage circuit storing data, the data including values of a designated rotation speed and a threshold for various temperatures; and a deviation detecting circuit detecting a deviation between the actual rotation speed and the designated rotation speed specified in a control signal supplied to the centrifugal fan, the deviation detecting circuit outputting a predetermined signal when the actual rotation speed exceeds the designated rotation speed by the deviation equal to or greater than the threshold, the deviation detecting circuit obtaining the threshold from the storage circuit in accordance with a level of a temperature specified in a temperature information signal.

4. An electronic apparatus comprising:

an enclosure;

a centrifugal fan enclosed in the enclosure, the centrifugal fan discharging air through a ventilation opening through rotation of a rotor;

a dust catcher located in an air passage extending from the ventilation opening;

a rotation speed detecting circuit connected to the centrifugal fan, the rotation speed detecting circuit designed to detect an actual rotation speed of the rotor; and a storage circuit storing data, the data including values of a designated rotation speed and a threshold for various temperatures; and a deviation detecting circuit designed to detect a deviation between the actual rotation speed and the designated rotation speed specified in a control signal supplied to the centrifugal fan, the deviation detecting circuit outputting a predetermined detection signal, the predetermined detection signal specifying accumulation of dust in a predetermined amount at the dust catcher when the actual rotation speed exceeds the designated rotation speed by the deviation equal to or greater than the threshold, the deviation detecting circuit obtaining the threshold from the storage circuit in accordance with a level of a temperature specified in a temperature information signal.

5. A method of controlling an electronic apparatus, comprising:

supplying a control signal to a centrifugal fan, the control signal specifying a designated rotation speed of a rotor, the rotor rotating to generate airflow toward a dust catcher located in an air passage extending from the centrifugal fan;

detecting an actual rotation speed of the rotor;

obtaining a threshold from data stored in a storage circuit in accordance with a level of a temperature specified in a temperature information signal, the data including values of the designated rotation speed and the threshold for various temperatures;

detecting a deviation between the designated rotation speed and the actual rotation speed; and outputting a predetermined detection signal specifying accumulation of dust in a predetermined amount at the dust catcher when the actual rotation speed exceeds the designated rotation speed by the deviation equal to or greater than the threshold.

* * * * *